United States Patent
Cai et al.

(10) Patent No.: US 11,309,871 B2
(45) Date of Patent: Apr. 19, 2022

(54) NARROW PULSE GENERATION CIRCUIT USED IN SEQUENTIAL EQUIVALENT SAMPLING SYSTEM

(71) Applicant: Nantong Institute of Nanjing University of Posts and Telecommunications Co., Ltd., Jiangsu (CN)

(72) Inventors: Zhikuang Cai, Jiangsu (CN); Xuanchen Qi, Jiangsu (CN); Wenhua Lin, Jiangsu (CN); Guowei Shi, Jiangsu (CN); Jian Xiao, Jiangsu (CN); Yufeng Guo, Jiangsu (CN)

(73) Assignee: Nantong Institute of Nanjing University of Posts and Telecommunications Co., Ltd., Jiangsu (CN)

(*) Notice: Subject to any disclaimer, the term of this patent is extended or adjusted under 35 U.S.C. 154(b) by 0 days.

(21) Appl. No.: 17/287,117

(22) PCT Filed: Jan. 14, 2019

(86) PCT No.: PCT/CN2019/071519
§ 371 (c)(1),
(2) Date: Apr. 21, 2021

(87) PCT Pub. No.: WO2019/237733
PCT Pub. Date: Dec. 19, 2019

(65) Prior Publication Data
US 2021/0359668 A1  Nov. 18, 2021

(30) Foreign Application Priority Data

Jun. 11, 2018  (CN) .......................... 201810592422.0

(51) Int. Cl.
*H03K 3/021* (2006.01)
*H04B 1/04* (2006.01)
*H04B 1/24* (2006.01)

(52) U.S. Cl.
CPC ............... *H03K 3/021* (2013.01); *H04B 1/04* (2013.01); *H04B 1/24* (2013.01); *H04B 2001/0408* (2013.01)

(58) Field of Classification Search
CPC . H03K 3/021; H04B 1/04; H04B 1/24; H04B 2001/0408
(Continued)

(56) References Cited

U.S. PATENT DOCUMENTS

2006/0267652 A1* 11/2006 Kabelly .................. H03K 3/33
327/173

FOREIGN PATENT DOCUMENTS

| CN | 201323559 | 10/2009 |
|---|---|---|
| CN | 203278774 | 11/2013 |

(Continued)

OTHER PUBLICATIONS

"International Search Report (Form PCT/ISA/210) of PCT/CN2019/071519," dated Apr. 4, 2019, with English translation thereof, pp. 1-5.

*Primary Examiner* — Tomi Skibinski
(74) *Attorney, Agent, or Firm* — JCIP Global Inc.

(57) ABSTRACT

A narrow pulse generation circuit used in a sequential equivalent sampling system. The circuit comprises a crystal oscillator, an edge sharpening circuit, an avalanche transistor single-tube amplifying circuit and a shaping network connected in sequence, wherein the edge sharpening circuit is used for carrying out edge sharpening on a square wave signal generated by the crystal oscillator; the avalanche transistor single-tube amplifying circuit is used for carrying (Continued)

out avalanche amplification on the sharpened square wave signal to generate a Gaussian pulse signal to adjust the amplitude of a pulse; and the RC shaping network is used for shaping the Gaussian pulse signal to adjust the pulse width at the bottom of the pulse to form a narrow pulse signal. The narrow pulse circuit has a simple structure and narrow pulse width at the bottom and facilitates increasing a signal-to-noise ratio of a whole sequential sampling system.

6 Claims, 3 Drawing Sheets

(58) Field of Classification Search
USPC .......................................................... 327/207
See application file for complete search history.

(56) References Cited

FOREIGN PATENT DOCUMENTS

| | | |
|---|---|---|
| CN | 106130510 | 11/2016 |
| CN | 205961074 | 2/2017 |
| CN | 106849916 | 6/2017 |
| CN | 108418570 | 8/2018 |
| CN | 208316694 | 1/2019 |

* cited by examiner

NARROW PULSE GENERATION CIRCUIT USED IN SEQUENTIAL EQUIVALENT SAMPLING SYSTEM

CROSS-REFERENCE TO RELATED APPLICATION

This application is a 371 of international application of PCT application serial no. PCT/CN2019/071519, filed on Jan. 14, 2019, which claims the priority benefits of China Patent Application No. 201810592422.0, filed on Jun. 11, 2018. The entirety of each of the above mentioned patent applications is hereby incorporated by reference herein and made a part of this specification.

BACKGROUND

Technical Field

The present invention relates to the electronic field, and in particular, to a narrow pulse receiving circuit used in a sampling circuit and for acquisition of ground-penetrating radar (GPR) signals.

Description of Related Art

In recent years, ultra-wideband GPR has been applied to structural inspection of transport facilities as a non-destructive testing technology; and receives ultra-wideband signals, thus having an extremely narrow pulse and extremely wide frequency. If GPR signals are acquired in a real-time sampling manner used in the conventional GPR system, a sampling frequency must be at least 2 times greater than a signal frequency. In the ultra-wideband application, for example, in an application where a signal bandwidth is greater than 1 GHz, due to limitations from the sampling theorem, a high-speed integrated A/D chip with a sampling rate greater than 2 GHz or a high-speed sampling device is often required. However, the integrated A/D chip with the sampling rate greater than 2 GHz is rather expensive at present and generally costs a few hundred dollars. The high-speed sampling device also has such shortcomings as a high cost and a large size. Moreover, the main indicators of A/D conversion include a sampling rate and sampling accuracy which, however, contradict each other in A/D development. Therefore, the A/D chip usually has a high sampling rate but low sampling accuracy, or high sampling accuracy but a low sampling rate; or a compromise is made.

Viewed from the current technology and products, the low-speed and low-resolution data acquisition technology is quite mature and is relatively easy to implement. A single ADC can meet the requirements, and the stability and reliability of the products are beyond doubt. A high-speed data acquisition technology is the frontier of the information base. At present, China lags behind in the high-speed data acquisition technology which is the bottleneck of information technology in our country. The research and development of this technology has important values for the military and civilian fields in our country, thus having a broad prospect. The high-speed data sampling technology which is most widely applied at present includes a multi-AD parallel sampling technique and a random sampling technique. However, these two sampling techniques both rely on an accurate-data control circuit and signal recombination circuit, thus having rather complicated control and signal processing algorithms.

The existing foreign data collection system is expensive, large in size, and complicated in operation; and fails to well unify the sampling frequency and sampling accuracy. Therefore, although the technology development starts early in the foreign countries, a relatively cheap sampling circuit easy in operation still needs to be studied.

To sum up, researchers and companies at home and abroad have done a lot of work in the research of a high-speed data acquisition system. However, there is still a big gap between the domestic and foreign countries in the high-speed data acquisition technology. The domestic high-speed sampling technology is not mature and the feasibility of an acquisition system is not high, while the foreign high-speed data acquisition technology has high feasibility but complicated operation and high cost. Therefore, it is of great significance to design a simple high-speed data sampling system.

Chinese patent No. 201620801589.X discloses a tunable trigger-type ultra-broadband narrow pulse generation device and method. A control unit controls a high-speed signal generation unit to send a unipolar rectangular wave signal; a bipolar trigger unit converts the unipolar rectangular wave signal into a bipolar rectangular wave signal; a differentiator converts the bipolar rectangular wave signal into a bipolar sharp pulse signal; stimulated by the bipolar sharp pulse signal, an avalanche unit generates a positive-polarity zero-order Gaussian pulse signal; a pulse shaping unit converts the positive-polarity zero-order Gaussian pulse signal into a negative-polarity first-order Gaussian pulse signal; an edge detection unit detects a half pulse width of the negative-polarity first-order Gaussian pulse signal; the control unit receives pulse width information and controls a tuner to tune high and low-level voltages of the bipolar trigger unit, to form a feedback; and when detecting that the half pulse width reaches a minimum value, the control unit completes the control over the tuner.

SUMMARY

Technical Problem

Invention objective: To overcome the shortcomings in the prior art, the present invention provides a simple and high-efficiency narrow pulse generation circuit used in a sequential equivalent sampling system.

Technical Solution

To achieve the foregoing objective, the present invention adopts the following technical solution:

A narrow pulse generation circuit used in a sequential equivalent sampling system includes a crystal oscillator, an edge sharpening circuit, an avalanche transistor single-tube amplifying circuit, and an RC shaping network that are connected in sequence, where:

the edge sharpening circuit is used for carrying out edge sharpening on a square wave signal generated by the crystal oscillator;

the avalanche transistor single-tube amplifying circuit is used for carrying out avalanche amplification on the sharpened square wave signal to generate a Gaussian pulse signal to adjust the amplitude of a pulse; and the RC shaping network is used for shaping the Gaussian pulse signal to adjust the pulse width at the bottom of the pulse to form a narrow pulse signal.

Preferably, the edge sharpening circuit includes a first resistor R1, a first capacitor C1, a second resistor R2, a step recovery diode SRD, a second capacitor C2, and a sixth resistor R6, where the first resistor R1, the first capacitor C1, the second capacitor C2, the sixth resistor R6, and a negative terminal of a power supply are connected in sequence; one end of the crystal oscillator is grounded, and the other end is connected to the first resistor R1; one end of the step recovery diode SRD is grounded, and the other end is connected between the first capacitor C1 and the second capacitor C2; and one end of the second resistor R2 is connected to a positive terminal of the power supply, and the other end is connected between the first capacitor C1 and the second capacitor C2.

Preferably, the avalanche transistor single-tube amplifying circuit includes a first resistor R5, an avalanche transistor Q1, a third resistor R3, a first inductor L1, a fourth resistor R4, a third capacitor C3, a fourth capacitor C4, and a seventh resistor R7, where one end of the first resistor R5 is connected to an end of the second capacitor C2 that is connected to the negative terminal of the power supply, and the other end of the first resistor R5 is connected to a base of the avalanche transistor Q1; an emitter of the avalanche transistor Q1 is grounded; a collector, the third resistor R3, the first inductor L1, the fourth resistor R4, and the positive terminal of the power supply are connected in sequence; one end of the third capacitor C3 is grounded, and the other end is connected between the first inductor L1 and the fourth resistor R4; one end of the fourth capacitor C4 is connected to the collector of the avalanche transistor Q1, and the other end is connected to the seventh resistor R7; and the seventh resistor R7 is grounded.

Preferably, the RC shaping network includes a fifth capacitor C5, a Schottky diode D2, a coupling capacitor Cc, a load resistor $R_L$, a ninth resistor R9, a second inductor L2, a sixth capacitor C6, and a tenth resistor R10, where one end of the fifth capacitor C5 is connected between the fourth capacitor C4 and the seventh resistor R7; the other end of the fifth capacitor C5, the Schottky diode D2, the coupling capacitor Cc, and the load resistor $R_L$ are connected in sequence; the load resistor $R_L$ is grounded; one end of the ninth resistor R9 is connected between the fifth capacitor C5 and the Schottky diode D2; and the other end of the ninth resistor R9, the second inductor L2, and the tenth resistor R10 are connected in sequence; the tenth resistor R10 is connected to the positive terminal of the power supply; one end of the sixth capacitor C6 is grounded, and the other end is connected between the second inductor L2 and the tenth resistor R10.

Advantageous Effect

Compared to the prior art, the present invention has the following advantageous effects:

The present invention effectively realizes design and acquisition of a narrow pulse circuit by using a simple circuit. The whole narrow pulse circuit has a simple structure and is highly feasible, facilitating acquisition and processing of radar signals.

DESCRIPTION OF THE EMBODIMENTS

Figure 1:
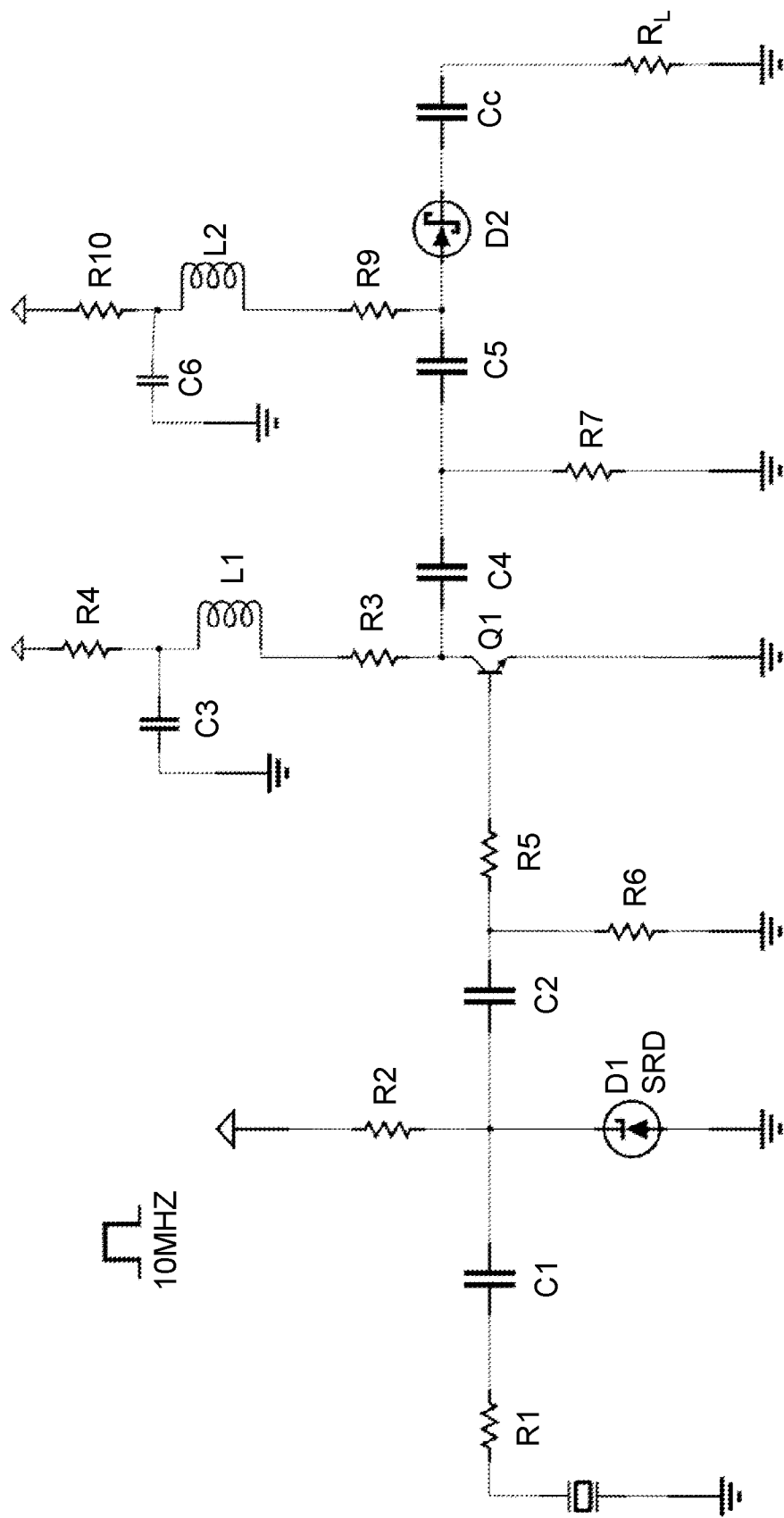
FIG. 1 is a simulation diagram of generation of a narrow pulse.
Figure 2:
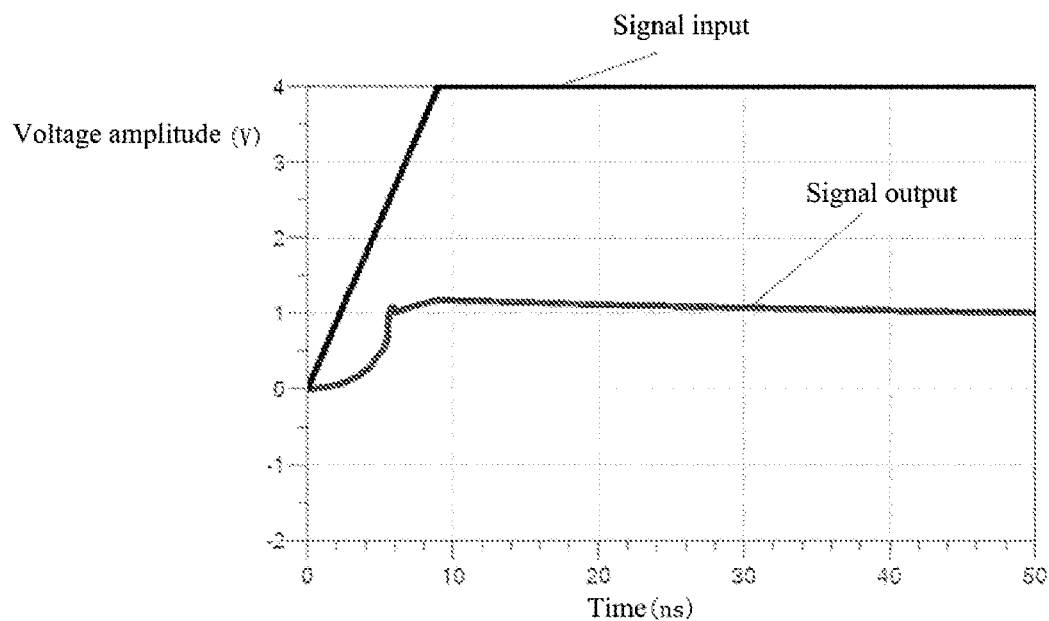
FIG. 2 is a diagram of an edge sharpening circuit.
Figure 3:
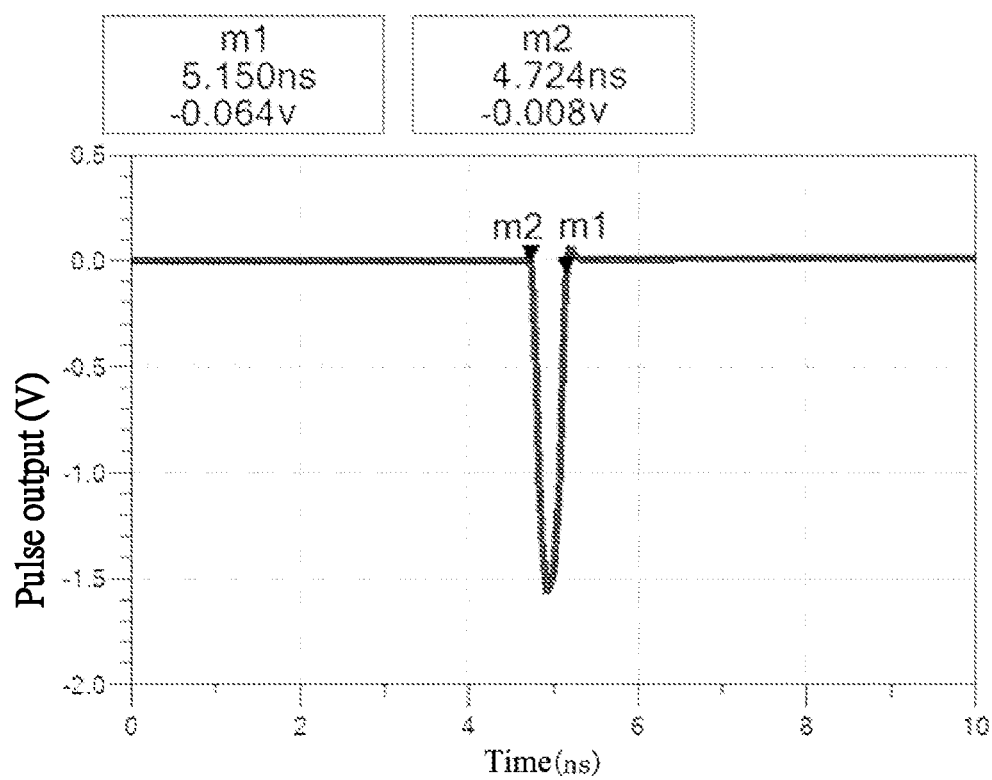
FIG. 3 shows simulation of a narrow pulse.
Figure 4:
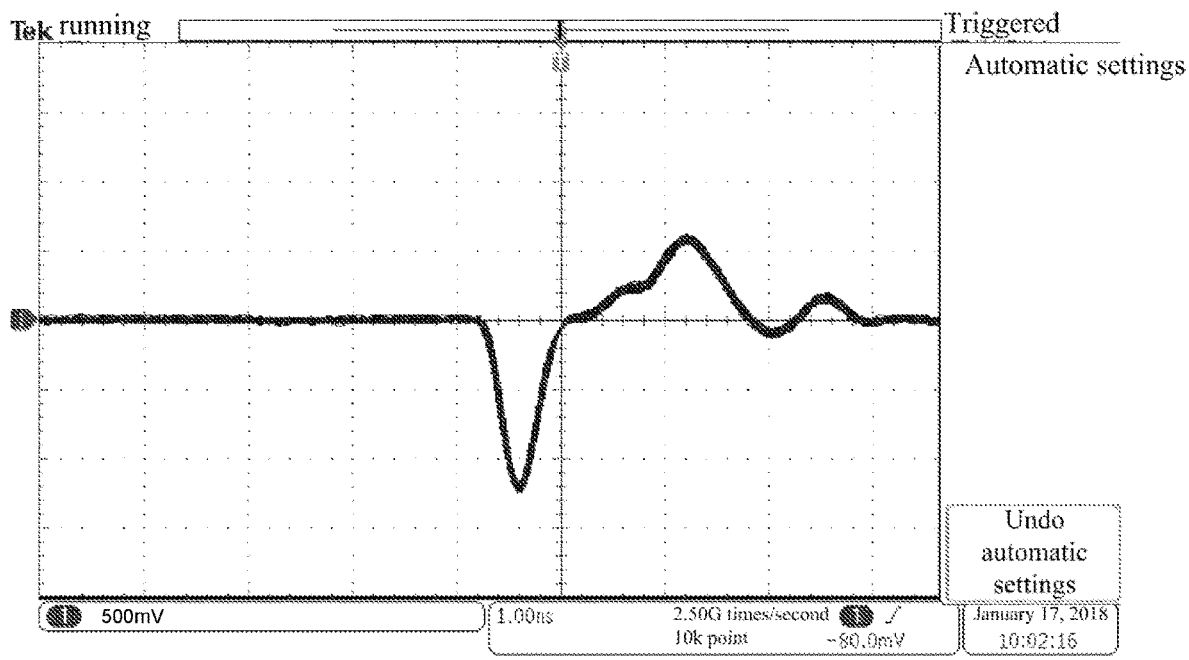
FIG. 4 shows actual detection of a narrow pulse.

The present invention is further described below with reference to the accompanying drawings and a specific embodiment. It should be understood that, these instances are merely used to describe the present invention, but are not intended to limit the scope of the present invention. Various equivalent modifications made to the present invention by those skilled in the art after reviewing the present invention shall all fall within the scope limited by the appended claims of the present application.

A narrow pulse generation circuit used in a sequential equivalent sampling system includes a crystal oscillator, an edge sharpening circuit, an avalanche transistor single-tube amplifying circuit and an RC shaping network that are connected in sequence. The whole pulse generation circuit is composed of an SRD and an avalanche transistor, thus having a simple circuit structure and high reliability, where:

The edge sharpening circuit is used for carrying out edge sharpening on a square wave signal adjustable in time delay and generated by the crystal oscillator; and the sharpened square wave signal is sent to the avalanche transistor single-tube amplifying circuit to trigger an avalanche breakdown of the avalanche transistor. The edge sharpening circuit includes a first resistor R1, a first capacitor C1, a second resistor R2, a step recovery diode SRD, a second capacitor C2, and a sixth resistor R6, where the first resistor R1, the first capacitor C1, the second capacitor C2, the sixth resistor R6, and a negative terminal of a power supply are connected in sequence. One end of the crystal oscillator is grounded, and the other end is connected to the first resistor R1. One end of the SRD is grounded, and the other end is connected between the first capacitor C1 and the second capacitor C2. One end of the second resistor R2 is connected to a positive terminal of the power supply, and the other end is connected between the first capacitor C1 and the second capacitor C2. The square wave signal generated by the crystal oscillator is subjected to edge sharpening by the step recovery diode SRD. Before the arrival of a pulse signal, the step recovery diode SRD is in a positive conduction state under the effect of a DC bias voltage, and stores carriers in this case. When the pulse signal arrives, the step recovery diode SRD is in a reverse biased state, and consumes the stored carriers in this case. When the carriers are depleted, a cutoff state occurs immediately, pulling up the potential instantly, thus realizing sharpening of a rising edge of an input square wave. In addition, the first resistor R1 and the first capacitor C1 sharpen a rising edge of the square wave signal generated by the crystal oscillator; the second resistor R2 and the sixth resistor R6 form a differentiating circuit which conducts differential sharpening on the signal sharpened by the step recovery diode SRD to extract the edge of the signal, realizing generation of a low-amplitude pulse signal in this case. The rising edge of the sharpened square wave is about 1 ns, namely, 0.9 ns to 1.1 ns.

The avalanche transistor single-tube amplifying circuit is used for carrying out avalanche amplification on the sharpened square wave signal to generate a Gaussian pulse signal to adjust the amplitude of a pulse. The avalanche transistor single-tube amplifying circuit includes a first resistor R5, an avalanche transistor Q1, a third resistor R3, a first inductor L1, a fourth resistor R4, a third capacitor C3, a fourth capacitor C4, and a seventh resistor R7. One end of the first resistor R5 is connected to an end of the second capacitor C2 that is connected to the negative terminal of the power supply, and the other end of the first resistor R5 is connected to a base of the avalanche transistor Q1. An emitter of the avalanche transistor Q1 is grounded. A collector, the third resistor R3, the first inductor L1, the fourth resistor R4, and the positive terminal of the power supply are connected in sequence. One end of the third capacitor C3 is grounded, and the other end is connected between the first inductor L1 and the fourth resistor R4. One end of the fourth capacitor C4 is connected to the collector of the avalanche transistor Q1, and the other end is connected to the seventh resistor R7; and the seventh resistor R7 is grounded. The fourth resistor R4 and the third capacitor C3 form a differentiating circuit to isolate the signals. The low-amplitude pulse signal triggers an avalanche breakdown of the avalanche transistor at an exposed part of the pulse, and the Gaussian pulse signal is generated after the avalanche breakdown. After the sharpened square wave signal, as an input signal to the avalanche transistor, is shaped by the shaping network based on an avalanche multiplier effect of the avalanche transistor, a narrow pulse signal is formed.

The RC shaping network is used for shaping the Gaussian pulse signal to adjust the pulse width at the bottom of the pulse to form a narrow pulse signal. A waveform of a narrow pulse circuit can be adjusted according to the pulse width and pulse amplitude required by the system. The RC shaping network includes a fifth capacitor C5, a Schottky diode D2, a coupling capacitor Cc, a load resistor $R_L$, a ninth resistor R9, a second inductor L2, a sixth capacitor C6, and a tenth resistor R10. One end of the fifth capacitor C5 is connected between the fourth capacitor C4 and the seventh resistor R7; and the other end of the fifth capacitor C5, the Schottky diode D2, the coupling capacitor Cc, and the load resistor $R_L$ are connected in sequence. The load resistor $R_L$ is grounded. One end of the ninth resistor R9 is connected between the fifth capacitor C5 and the Schottky diode D2; and the other end of the ninth resistor R9, the second inductor L2, and the tenth resistor R10 are connected in sequence. The tenth resistor R10 is connected to the positive terminal of the power supply. One end of the sixth capacitor C6 is grounded, and the other end is connected between the second inductor L2 and the tenth resistor R10. In order to reduce the width of a Gaussian pulse, the Schottky diode is used to realize interception of the pulse, so as to enable conduction of a part exceeding a transistor voltage drop. The Gaussian pulse signal after the interception is shaped by the RC shaping network, to complete adjustment on the pulse width and amplitude at the bottom according to actual requirements. The generated narrow pulse part is reversed through a common emitter amplification circuit, to generate a pair of synchronized sampling and holding signals, which can effectively control on/off of samples. The ninth resistor R9, the second inductor L2, the sixth capacitor C6, and the tenth resistor R10 form a voltage bias circuit for implementing DC bias.

The square wave signal generated by the crystal oscillator is subjected to edge sharpening by the step recovery diode SRD. Before the arrival of a pulse signal, the step recovery diode SRD is in a positive conduction state under the effect of a DC bias voltage, and stores carriers in this case. When the pulse signal arrives, the step recovery diode SRD is in a reverse biased state, and consumes the stored carriers in this case. When the carriers are depleted, a cutoff state occurs immediately, pulling up the potential instantly, thus realizing steepening of a rising edge of an input signal. Because the avalanche multiplier effect of the avalanche transistor is relevant to the edge steepening of the pulse signal, a differentiating circuit is formed by the capacitor $C_2$ and the resistor R6 to extract the edge of the square wave signal and reduce its duty ratio, thus facilitating occurrence of the avalanche multiplier effect of the avalanche transistor.

A voltage source is a DC bias voltage which enables the avalanche breakdown of the avalanche transistor, and the avalanche transistor is in a critical avalanche state before the square wave signal arrives. The first inductor L1 is a voltage filter inductor. Before occurrence of the avalanche breakdown, the bias voltage charges the second capacitor $C_2$, where a charging differential constant is $\tau=(R_3+R_4)C_2$. The value of R3 should not be too small; otherwise the partial pressure on the avalanche transistor is large, resulting in an increase in the power consumption of the whole avalanche circuit. The differential constant $\tau$ in the avalanche transistor single-tube amplifying circuit is less than the width of a positive pulse edge. Because the avalanche pulse is a negative pulse, the Schottky diode is used to output a pulse waveform and implement interception. A reverse cutoff time of the Schottky diode is rather short, and it only takes tens of picoseconds from a forward conduction time to the reverse cutoff time. Therefore, by use of the Schottky diode, a signal exceeding a threshold voltage can pass through the network, where the threshold voltage is determined by $V_d$. The pulse width is added to an RC network function in the latter stage, and thus the RC shaping network is formed by the coupling capacitor $C_C$ and the load resistor $R_L$.

$$H(jw) = \frac{R_L}{R_L + 1/jwC_c} = \frac{1}{1 + 1/jwR_LC_c}$$

$$|H(jw)| = \frac{1}{\sqrt{1+(1/wR_LC_c)^2}} = \frac{1}{\sqrt{1+(f_L/f)^2}}$$

A greater RC constant indicates a larger pulse amplitude and a wider pulse at the bottom. Likewise, a smaller RC constant indicates a smaller pulse amplitude. Therefore, it is required to select an appropriate RC value according to a time pulse requirement in a design process.

The narrow pulse circuit of the present invention has a simple structure and a narrow pulse at the bottom, facilitating increasing a signal-to-noise ratio of the whole sequential sampling system.

The above merely describes preferred embodiments of the present invention. It should be noted that, several improvements and modifications may be made by those of ordinary skill in the art without departing from the principle of the present invention, and these improvements and modifications should also be construed as falling within the protection scope of the present invention.

What is claimed is:

1. A narrow pulse generation circuit used in a sequential equivalent sampling system, comprising: a crystal oscillator, an edge sharpening circuit, an avalanche transistor single-tube amplifying circuit, and an RC shaping network that are connected in sequence, wherein:
   the edge sharpening circuit is used for carrying out edge sharpening on a square wave signal generated by the crystal oscillator;
   the avalanche transistor single-tube amplifying circuit is used for carrying out avalanche amplification on the sharpened square wave signal to generate a Gaussian pulse signal to adjust the amplitude of a pulse; and
   the RC shaping network is used for shaping the Gaussian pulse signal to adjust the pulse width at the bottom of the pulse to form a narrow pulse signal.

2. The narrow pulse generation circuit used in a sequential equivalent sampling system according to claim 1, wherein the edge sharpening circuit comprises a first resistor R1, a first capacitor C1, a second resistor R2, a step recovery diode SRD, a second capacitor C2, and a sixth resistor R6, wherein the first resistor R1, the first capacitor C1, the second capacitor C2, the sixth resistor R6, and a negative terminal of a power supply are connected in sequence; one end of the crystal oscillator is grounded, and the other end of the crystal oscillator is connected to the first resistor R1; one end of the step recovery diode SRD is grounded, and the other end of the step recovery diode SRD is connected between the first capacitor C1 and the second capacitor C2; and one end of the second resistor R2 is connected to a positive terminal of the power supply, and the other end of the second resistor R2 is connected between the first capacitor C1 and the second capacitor C2.

3. The narrow pulse generation circuit used in a sequential equivalent sampling system according to claim 1, wherein the avalanche transistor single-tube amplifying circuit comprises a first resistor R5, an avalanche transistor Q1, a third resistor R3, a first inductor L1, a fourth resistor R4, a third capacitor C3, a fourth capacitor C4, and a seventh resistor R7, wherein one end of the first resistor R5 is connected to an end of the second capacitor C2 that is connected to a negative terminal of a power supply, and the other end of the first resistor R5 is connected to a base of the avalanche transistor Q1; an emitter of the avalanche transistor Q1 is grounded and a collector of the avalanche transistor Q1, the third resistor R3, the first inductor L1, the fourth resistor R4, and a positive terminal of the power supply are connected in sequence; one end of the third capacitor C3 is grounded, and the other end of the third capacitor C3 is connected between the first inductor L1 and the fourth resistor R4; one end of the fourth capacitor C4 is connected to the collector of the avalanche transistor Q1, and the other end of the fourth capacitor C4 is connected to the seventh resistor R7; and the seventh resistor R7 is grounded.

4. The narrow pulse generation circuit used in a sequential equivalent sampling system according to claim 1, wherein the RC shaping network comprises a fifth capacitor C5, a Schottky diode D2, a coupling capacitor Cc, a load resistor RL, a ninth resistor R9, a second inductor L2, a sixth capacitor C6, and a tenth resistor R10, wherein one end of the fifth capacitor C5 is connected between the fourth capacitor C4 and the seventh resistor R7; and the other end of the fifth capacitor C5, the Schottky diode D2, the coupling capacitor Cc, and the load resistor RL are connected in sequence; the load resistor RL is grounded; one end of the ninth resistor R9 is connected between the fifth capacitor C5 and the Schottky diode D2; and the other end of the ninth resistor R9, the second inductor L2, and the tenth resistor R10 are connected in sequence; the tenth resistor R10 is connected to a positive terminal of a power supply one end of the sixth capacitor C6 is grounded, and the other end of the sixth capacitor C6 is connected between the second inductor L2 and the tenth resistor R10.

5. The narrow pulse generation circuit used in a sequential equivalent sampling system according to claim 1, wherein a differential constant $\tau$ in the avalanche transistor single-tube amplifying circuit is less than the width of a positive pulse edge.

6. The narrow pulse generation circuit used in a sequential equivalent sampling system according to claim 1, wherein the square wave sharpened by the edge sharpening circuit has a rising edge of 0.9 ns to 1.1 ns.

* * * * *